(12) United States Patent
Ho et al.

(10) Patent No.: US 10,573,581 B2
(45) Date of Patent: Feb. 25, 2020

(54) LEADFRAME

(71) Applicant: Texas Instruments Incorporated, Dallas, TX (US)

(72) Inventors: Chih-Chien Ho, New Taipei (TW); Chung-Hao Lin, New Taipei (TW); Yuh-Harng Chien, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 23 days.

(21) Appl. No.: 15/280,398

(22) Filed: Sep. 29, 2016

(65) Prior Publication Data
US 2018/0090419 A1    Mar. 29, 2018

(51) Int. Cl.
*H01L 23/495* (2006.01)

(52) U.S. Cl.
CPC ...... *H01L 23/4951* (2013.01); *H01L 23/4952* (2013.01); *H01L 23/49503* (2013.01); *H01L 23/49524* (2013.01); *H01L 23/49537* (2013.01); *H01L 23/49544* (2013.01); *H01L 23/49551* (2013.01); *H01L 23/49555* (2013.01); *H01L 23/49575* (2013.01); *H01L 2224/32245* (2013.01); *H01L 2924/14* (2013.01)

(58) Field of Classification Search
CPC ........... H01L 23/4951; H01L 23/49537; H01L 23/49555; H01L 2924/14; H01L 2224/32245; H01L 23/49575; H01L 23/49551; H01L 23/49544; H01L 23/49503; H01L 23/49524; H01L 23/4952
See application file for complete search history.

(56) References Cited

U.S. PATENT DOCUMENTS 8,901,721 B1 * 12/2014 Bai ..................... H01L 23/3107
257/666
2014/0191380 A1 * 7/2014 Lee ....................... H01L 24/97
257/676

* cited by examiner

*Primary Examiner* — Steven H Loke
*Assistant Examiner* — Juanita B Rhodes
(74) *Attorney, Agent, or Firm* — Dawn Jos; Charles A. Brill; Frank D. Cimino

(57) ABSTRACT

A leadframe has a peripheral frame. A die attach pad (DAP) is positioned inwardly and downwardly of the peripheral frame. Two spaced apart parallel arms engage one side of the DAP. In one embodiment the arms are portions of a U-shaped strap.

19 Claims, 4 Drawing Sheets

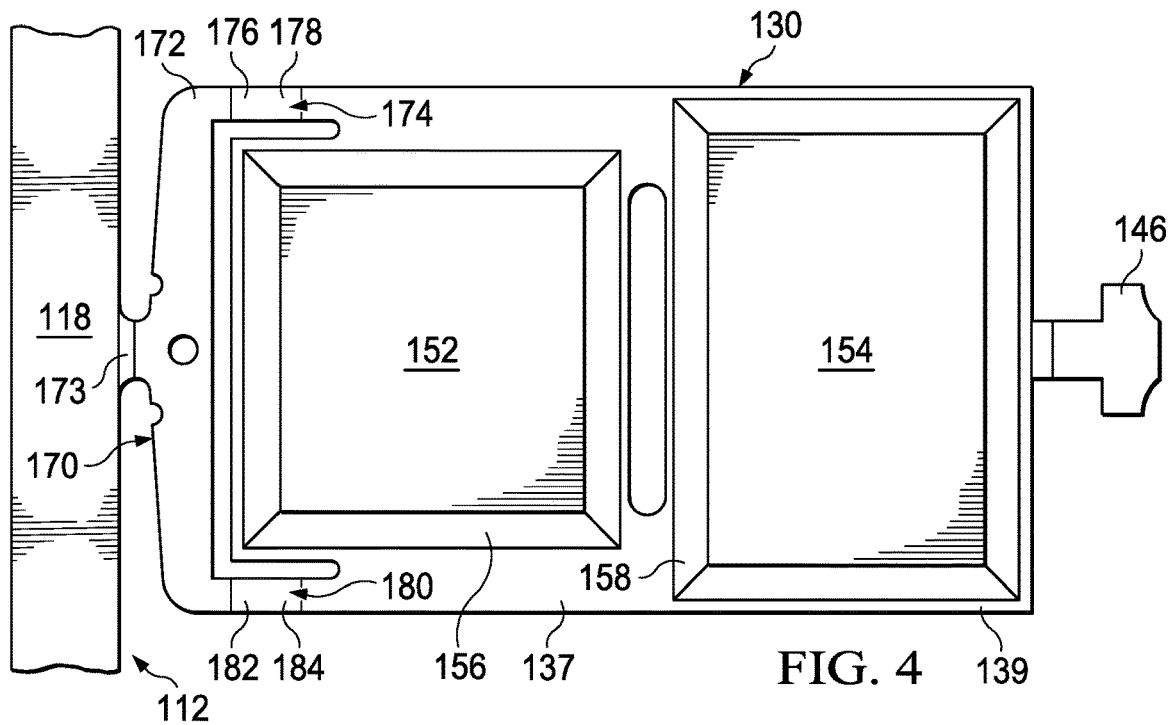
FIG. 4
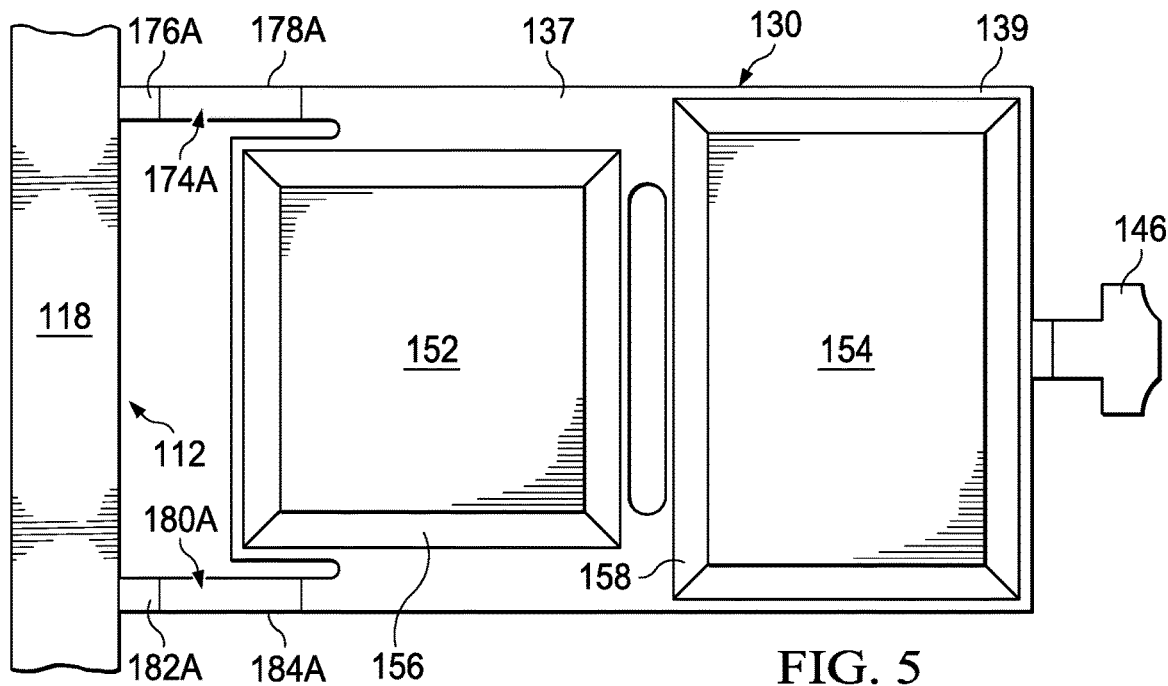
FIG. 5
201 — REPLACING THE ONE ARM DAP STRAP WITH A DAP STRAP ASSEMBLY HAVING TWO GENERALLY PARALLEL ARMS
FIG. 6

LEADFRAME

BACKGROUND

Integrated circuit packages typically include one or more integrated circuit dies and a metal leadframe that are encapsulated within a protective coating of plastic mold compound. Before encapsulation, the die(s) is/are mounted on and electrically connected to the metal leadframe. The leadframe has leads that remain partially exposed through the mold compound after encapsulation takes place. The leadframe allows the die(s) to be electrically connected to electrical components outside the integrated circuit package.

SUMMARY

A leadframe has a peripheral frame. A die attach pad (DAP) is positioned inwardly and downwardly of the peripheral frame. A generally U-shaped strap connects the peripheral frame and the DAP.

A leadframe has a peripheral frame. A die attach pad (DAP) is positioned inwardly and downwardly of the peripheral frame. Two spaced apart parallel arms engage one side of the DAP.

A leadframe has a peripheral frame with a first rail. A die attach pad (DAP) is positioned downwardly and inwardly of the peripheral frame and has a lateral side portion. First and second downwardly and inwardly extending parallel arms are positioned in spaced apart relationship and are operably supported at first ends thereof proximate opposite end portions of the first rail and are attached at second ends thereof proximate opposite end portions of the lateral side portion of the DAP.

BRIEF DESCRIPTION OF THE DRAWINGS

FIG. 4 is a top plan view of the leadframe assembly of FIG. 3.

FIG. 5 is a top plan view of an alternative embodiment of the leadframe assembly of FIG. 3.

FIG. 6 is a flow chart of a method of reconfiguring a leadframe to accept a larger die without increasing the leadframe footprint.

DETAILED DESCRIPTION

Figure 1:
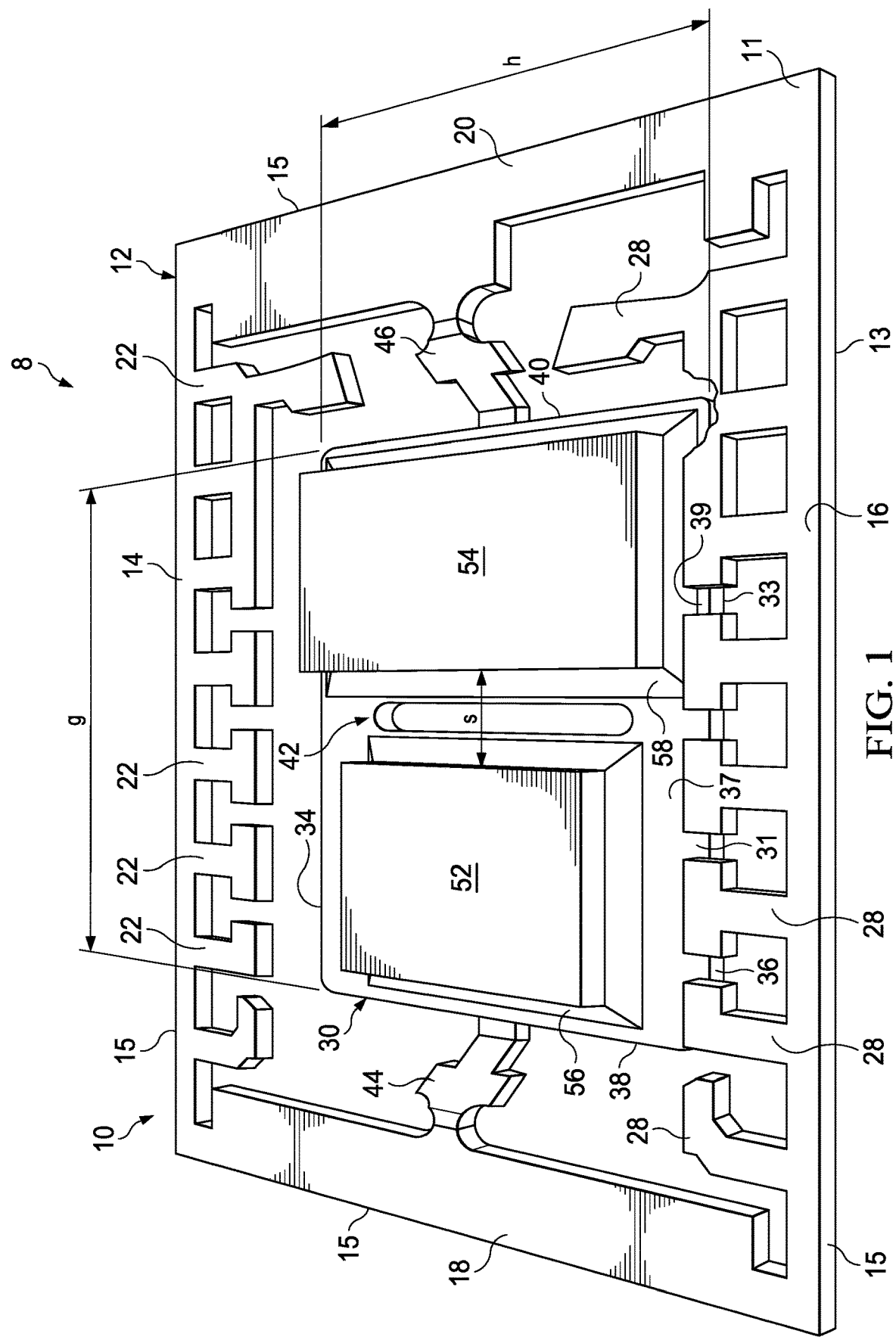
FIG. 1 is a top isometric view of a first leadframe assembly.

FIG. 1 is a top isometric view of a leadframe assembly 8. This assembly 8 includes a leadframe 10 having a top surface 11 and a bottom surface 13. The leadframe 10 has a generally rectangular peripheral frame 12 that includes a first longitudinal end rail 14, a second longitudinal end rail 16 opposite the first end rail 14, a first lateral side rail 18 and a second lateral side rail 20 opposite the first side rail 18. (It will be appreciated from the immediately preceding sentence that in order to establish a frame of reference for describing the leadframe assembly 8 of FIG. 1, a direction extending generally between the bottom and top of the sheet has been arbitrarily designated as "longitudinal" and that a direction generally perpendicular/transverse to the longitudinal direction is designated as "lateral.") The first end rail 14 has a first plurality of leads 22 extending inwardly therefrom and the second end rail 16 has a second plurality of leads 28 extending inwardly therefrom that may be in mirror image relationship with the first plurality of leads 22. The outer peripheral edge 15 of the generally rectangular peripheral frame 12 defines a leadframe footprint.

With continued reference to FIG. 1, a die attach pad (DAP) 30 is positioned inwardly and downwardly with respect to the peripheral frame 12. The DAP 30 has a top surface 31 and a bottom surface 33. (Terms such as "up," "down," "above," "below," "horizontal," "vertical," etc., are, like "lateral" and "longitudinal" discussed above, used in a relative sense herein for the purpose of describing the relative position and orientation of various objects and/or parts thereof. Thus, referring to the surface of a die pad as the top of the die pad simply means that it is the top surface in a frame of reference such as that shown and described in the specification and drawings. This disclosure does not use such terms to establish an absolute frame of reference with respect to the gravitational field of the Earth or another gravitational system. Thus, as used herein, the top surface of the DAP 30 refers to the surface to which the die 52 is attached, no matter how that surface may oriented with respect to any particular gravitational field.) The DAP also has a first longitudinal end 34, a second longitudinal end 36, a first lateral side 38 and a second lateral side 40. A central, longitudinally extending slot 42 divides the DAP into first and second lateral sections 37, 39 that are each adapted to support an integrated circuit die of a predetermined size. A first downwardly and inwardly extending DAP strap 44 attaches the first lateral side 38 of the DAP 30 to the leadframe first side rail 18 and a second downwardly and inwardly extending strap 46 attaches the second lateral side 40 of the DAP 30 to the leadframe second side rail 20. The DAP straps 44, 46 are positioned in mirror image relationship on the leadframe 30. The distance between the two lateral side edges of the DAP 30 is indicated at "g" in FIG. 1. The longitudinal distance between the two longitudinal end edges 34, 36 of the DAP is indicated at "h."

A first die 52 is mounted on the first lateral section 37 of the DAP 30 and a second die 54 is mounted on the second lateral section 39 of the DAP 30. The longitudinally extending slot 42 in combination with a predetermined minimum spacing distance "s" between the two dies 52, 54 prevent electrical arcing. In one embodiment the distance g is 3.63 mm, the distance h is 3.20 mm, and the distance "s" is 0.17 mm. First and second layers of die attach paste 56, 58 after curing, hold the dies 52, 54 in fixed relationship with the DAP 30.

Figure 2:
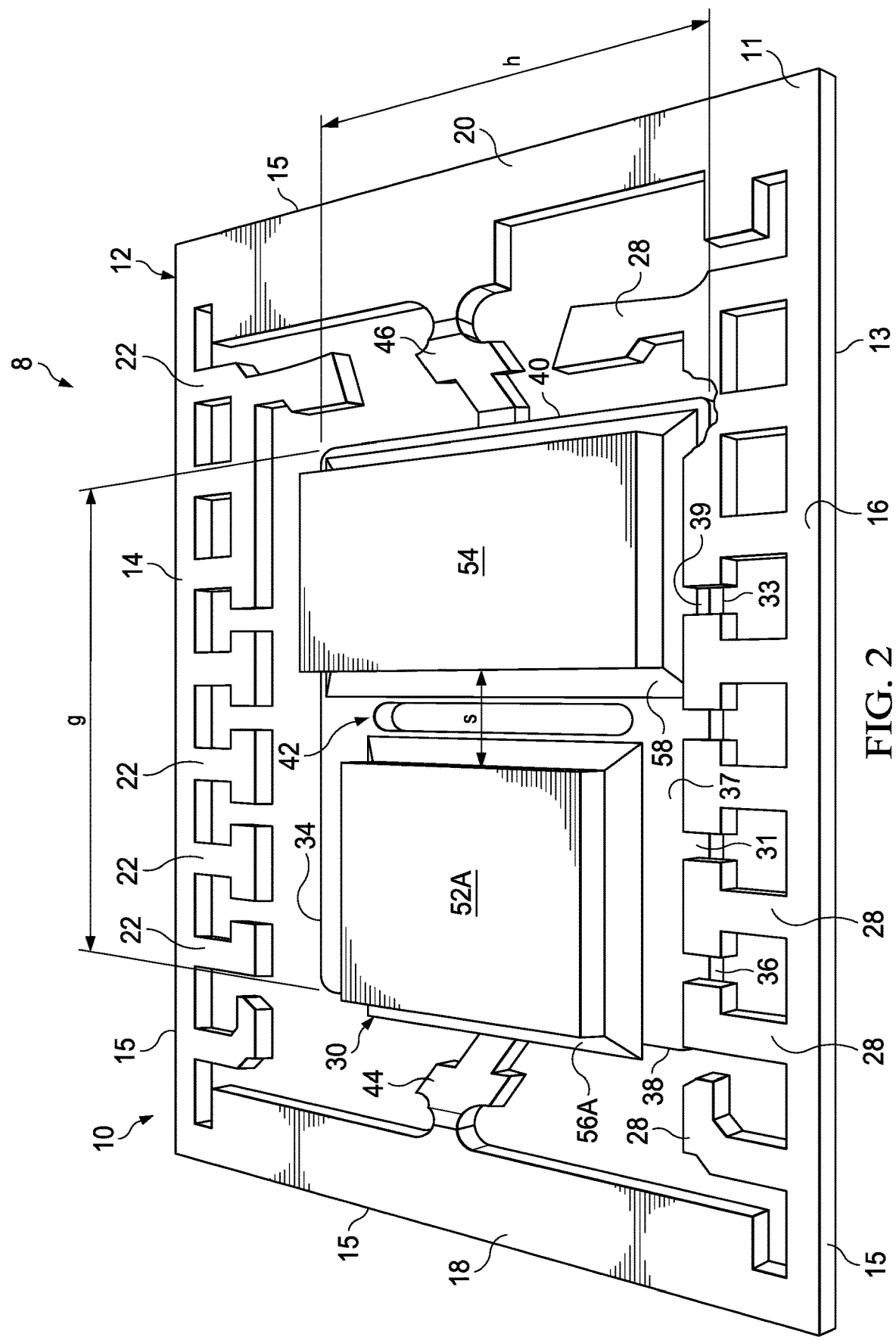
FIG. 2 is a top isometric view of another leadframe assembly.

FIG. 2 is a top isometric view of the leadframe assembly of FIG. 1, wherein the left side die 52 has been replaced with a larger die 52A. Except for numerals with an added "A", all of the structure and reference numerals in FIG. 2 correspond to those in FIG. 1. The problem illustrated by FIG. 2 is that the new, wider die 52A does not have sufficient space within the first lateral section 37 of the DAP to be properly attached. The die attach paste 56A bleeds over the edge of the DAP 30 and the outer lateral portion of the die 52A hangs over the edge of the DAP 30. The edge of the die 52A also rides up on the strap 44 causing the bottom surface of the die 52A to be positioned in non-parallel relationship with the top surface 31 of the DAP 30. Moving the die 52A closer to the die 54 would not solve this die mounting problem because of potential arcing if the gap distance "s" is not maintained. In some circumstances it might be possible to replace the larger die 52A with a smaller, denser die that provides the same circuit capabilities as the full sized new die 52A. However, designing and producing such a die, if it can be done at all, would require a considerable period of time and would substantially increase the cost of the associated integrated circuit packages.

Applicants have discovered that the above described problem may be obviated by use of a different DAP strap assembly. This different strap assembly, as described in detail below, enables lateral expansion of the DAP that, in turn, allows the outer lateral portion of the new wider die to be fully supported by the DAP. As a result, the gap distance "s" between the two dies on the DAP may stay the same and the leadframe footprint may also stay the same. Also the leads of the new leadframe may have the same lead pattern as those of the old leadframe.

Figure 3:
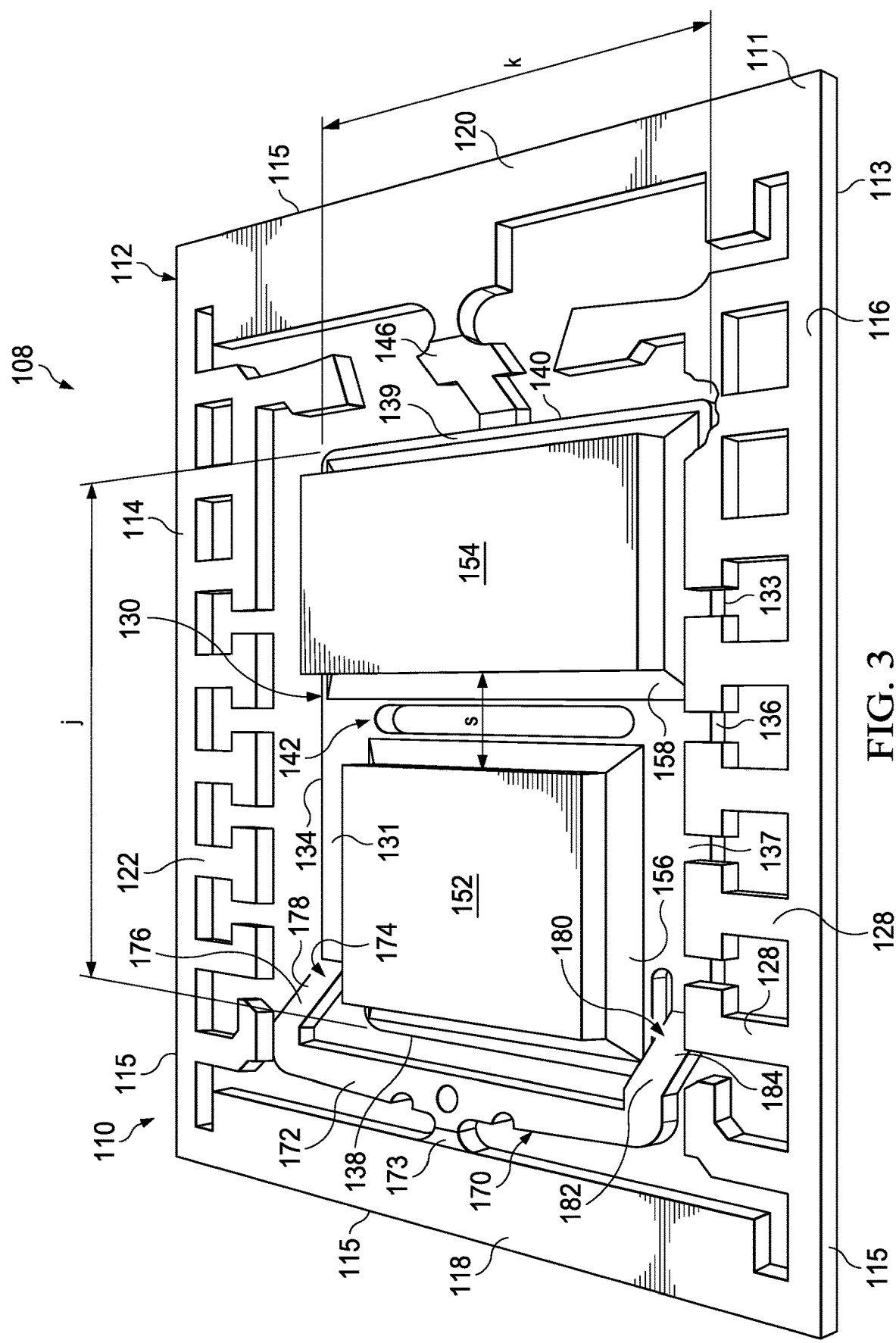
FIG. 3 is a top isometric view of yet another leadframe assembly.

FIG. 3 is a top isometric view of a leadframe assembly 108 that is a modified version of leadframe assembly 8 of FIG. 1. This reconfiguration enables use of a die 152 that is laterally wider than die 52, without changing the first leadframe footprint. In one embodiment the lead configuration in the second leadframe assembly 108 is identical to that of the first leadframe assembly 8. This leadframe assembly 108 includes a leadframe 110 having a top surface 111 and a bottom surface 113. The leadframe 110 has a generally rectangular peripheral frame 112, which includes first and second longitudinal end rails 114, 116, a first lateral side rail 118 and a second lateral side rail 120. The first end rail 114 has a first plurality of leads 122 extending inwardly therefrom and the second end rail 116 has a second plurality of leads 128 extending inwardly therefrom. The first and second plurality of leads may be positioned in mirror image relationship. The outer peripheral edge 115 of the generally rectangular peripheral frame 112 defines the leadframe footprint.

As further shown by FIG. 3, a die attachment pad (DAP) 130 is positioned inwardly of the peripheral frame 112 of the leadframe 110. The DAP 130 has a top surface 131 and a bottom surface 133. The DAP 130 also has a first longitudinal end 134, a second longitudinal end 136, a first lateral side 138 and a second lateral side 140. A central, longitudinally extending slot (void) 142 divides the DAP 130 into first and second lateral sections 137, 139 that are each adapted to support an integrated circuit die 152 154. The peripheral frame 112 and the DAP 130 may be parallel.

A first DAP strap assembly 170, FIG. 3, with two longitudinally spaced apart downwardly and inwardly extending arm portions 174, 180 attaches opposite ends of the first side 138 of the DAP 130 to the leadframe first side rail 118. The first DAP strap assembly 170, in the embodiment of FIG. 3, is a U-shaped strap assembly. (As used herein, the term "U-shaped" refers to a shape like that of the letter "U" without regard to its orientation. In other words, the opening of the "U" could face up, down, left, right or in some intermediate direction.) A downwardly and inwardly extending strap 146, which may be identical to strap 46 of the leadframe 10, attaches the second side 140 of the DAP 130 to the leadframe second side rail 120. The lateral distance between the outer edges of the DAP lateral sides 138, 140, i.e. the width of the DAP 130, is indicated by "j" in FIG. 3. The width "j" is larger than the width "g" described in FIG. 1. The longitudinal dimension, measured between the two longitudinal ends 134, 136 of the DAP 130 is indicated by "k" in FIG. 3. This dimension "k" is the same as the dimension "h" of the DAP 30 of FIG. 1. In one example embodiment "j" is 3.83 mm and "k" is 3.20 mm.

With continued reference to FIG. 3, a first die 152 is mounted on the first lateral section 137 and a second die 154 is mounted on the second lateral section 139 of the DAP 130. The width and length of the central slot 142 in the DAP 130 and the distance "s" between the two dies 152, 154 may be identical to the corresponding features shown in FIG. 1. First and second layers of die attach paste 156, 158 attach the dies 152, 154 to the associated lateral sections 137, 139 of the DAP 130 at the indicated spacing distance "s." The spacing distances "s" of the leadframe assembly 8 of FIG. 1, and of the leadframe assembly 108 of FIG. 3, in one embodiment, are identical. As mentioned above, the width "j" of the DAP 130 is larger than the width "g" of the first DAP 30 of FIG. 1. The enlarged width DAP 130 includes a portion that extends laterally between the two arms 178, 180. The enlarged width of the DAP 130 enables a die 152, which is wider than the die 52 supported by the first DAP 30, to be fully supported on the DAP 130 of FIG. 3. In one example embodiment the width of die 52 is 1.34 mm and the width of die 152 is 1.54 mm.

It may be seen from FIG. 3 that a portion of the die 152 extends laterally between the two arm portions 174, 180 of the U-shaped strap 170, such that the die 152 is supported across its entire width by the first (left) lateral section 137 of the DAP 130. Similarly, the die attach paste 156 that attaches the die 152 to the DAP 130 extends laterally between the two arm portions 174, 180 and extends laterally slightly farther than the die 152 itself. Thus, in this embodiment the leadframe assembly 108 is essentially identical to leadframe assembly 8, except that the DAP 130 is expanded laterally such that one lateral side of the DAP 130 is attached by the U-shaped strap 170 to the leadframe rail 118. More specifically, the U-shaped ("longhorn-shaped") strap 170 has a central body portion 172 and two downwardly and inwardly extending arm portions 174, 180 integrally attached at either end of the central body portion 172. Each arm portion 174, 180 has a proximal end 176, 182 attached to the central body portion 172 and a distal end 178, 184 attached to opposite longitudinal end portions of the DAP left lateral section 137. In some embodiments the arms 174, 180 are generally parallel. The central body portion 172 may be attached at a mid-portion 173 thereof to a mid-portion of the first leadframe side rail 118. Again, the DAP 130 is laterally larger than the DAP 30 of FIG. 1. This extra lateral width is provided without changing the spacing between dies. Thus, the spacing "s" between dies 152 and 154 is identical to the spacing "s" between dies 52 and 54. As illustrated in the embodiment of FIG. 3, the leadframe 110 first and second plurality of leads 122, 128 may be configured identical to the first and second plurality of leads 22, 28 of the leadframe 10.

FIG. 4 is a top plan view of the DAP 130 attached to the leadframe rail 118 by the U-shaped strap 170 as described with reference to FIG. 3, with identical parts designated by identical reference numerals.

FIG. 5 is a top plan view of an alternative embodiment of the DAP support assembly shown in FIGS. 3 and 4. In the embodiment of FIG. 5, the DAP 130 is supported by downwardly and laterally extending arms 174A and 180A. Arm 180A is connected at a proximal end 182A directly to leadframe rail 118 and is connected at a distal end 184A to the DAP 130. Similarly, arm 174A is connected at a proximal end 176A directly to leadframe rail 118 and is connected at a distal end 178A to the DAP 130. Thus in FIG. 5, the transverse central body portion of the U-shaped strap 170 has been obviated by use of two slightly longer arms 174A, 180A, but the function performed is essentially the same. It may be seen from FIGS. 4 and 5 that in these embodiments the laterally outwardly extending section of the DAP may be longitudinally inwardly recessed from the arms 174, 180 or 174A, 180A.

FIG. 6 illustrates a method of reconfiguring a leadframe having a die attach pad (DAP) supported at one lateral side thereof by a one arm DAP strap. The method includes, as shown at block 201, replacing the one arm DAP strap with a DAP strap assembly having two generally parallel arms. This method enables the DAP of the leadframe to be expanded laterally between the two arms to accommodate a larger die without changing the footprint of the leadframe.

Leadframe assemblies and methods of reconfiguring a leadframe that enables a larger die to be supported on a die attach pad of the leadframe without expanding the leadframe footprint have been described in detail herein. Alternative embodiments of the disclosed leadframe assemblies and methods may occur to those skilled in the art after reading this disclosure. It is intended that the language of the claims be broadly construed so as to cover such alternative embodiments, except as limited by the prior art.

What is claimed is:

1. An integrated circuit (IC) package comprising:
a plurality of leads, each of the plurality of leads including a surface along a first plane;
a die attach pad including a surface along a second plane, the second plane parallel to and offset from the first plane;
a first arm portion and a second arm portion extending from the die attach pad at an angle with respect to the second plane, wherein the first arm portion and the second arm portion are parallel to each other; and
a body portion connecting the first arm portion and the second arm portion, the body portion having a surface along the first plane.

2. The IC package of claim 1 further comprising a die, attached to the die attach pad, and electrically connected to at least one of the plurality of leads.

3. The IC package of claim 1, wherein the first arm portion and the second arm portion respectively extend from opposite sides of the die attach pad.

4. The IC package of claim 1, wherein the body portion, the first arm portion, and the second arm portion together form a U shape from a top view of the IC package.

5. The IC package of claim 1, wherein the plurality of leads includes a first plurality of leads and a second plurality of leads opposite to the first plurality of leads, and wherein the body portion, the first arm portion, and the second arm portion are located in between the first plurality of leads and the second plurality of leads.

6. The IC package of claim 2, wherein the die is located between the first arm portion and the second arm portion.

7. The IC package of claim 1, wherein the body portion includes a hole.

8. The IC package of claim 1, further comprising a mid-portion attached to the body portion, the mid-portion adapted to be attached to a peripheral frame.

9. An integrated circuit (IC) package comprising:
a plurality of leads, each of the plurality of leads including a surface along a first plane;
a die attach pad including a surface along a second plane, the second plane parallel to and offset from the first plane, the die attach pad including a first lateral section and a second lateral section;
a first die attached to the first lateral section and a second die attached to the second lateral section;
a first arm portion and a second arm portion extending from the die attach pad at an angle with respect to the second plane; and
a body portion connecting the first arm portion and the second arm portion, the body portion having a surface along the first plane.

10. The IC package of claim 9 further comprising a slot extending substantially between the first lateral section and the second lateral section.

11. The IC package of claim 9, wherein the first die and the second die are electrically connected to at least one of the plurality of leads.

12. The IC package of claim 9, wherein the first arm portion and the second arm portion respectively extend from opposite sides of the die attach pad.

13. The IC package of claim 9, wherein the body portion, the first arm portion, and the second arm portion together form a U shape from a top view of the IC package.

14. The IC package of claim 9 further comprising a third arm portion extending from the die attach pad opposite to the first arm portion and the second arm portion.

15. The IC package of claim 14, wherein the plurality of leads includes a first plurality of leads and a second plurality of leads opposite to the first plurality of leads, and wherein the body portion, the first arm portion, and the second arm portion are located in between the first plurality of leads and the second plurality of leads.

16. The IC package of claim 15, wherein the third arm portion is located in between the first plurality of leads and the second plurality of leads.

17. The IC package of claim 14, wherein the third arm is adapted to be attached to a peripheral frame.

18. The IC package of claim 9, wherein the body portion includes a mid-portion adapted to be attached to a peripheral frame.

19. The IC package of claim 9, wherein the second plane is below the first plane from a side view of the IC package.

* * * * *